(12) United States Patent
Lojek

(10) Patent No.: US 7,169,660 B2
(45) Date of Patent: Jan. 30, 2007

(54) LITHOGRAPHY-INDEPENDENT FABRICATION OF SMALL OPENINGS FOR FORMING VERTICAL MOS TRANSISTOR

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/977,161

(22) Filed: Oct. 28, 2004

(65) Prior Publication Data

US 2005/0074962 A1    Apr. 7, 2005

Related U.S. Application Data

(63) Continuation-in-part of application No. 10/761,876, filed on Jan. 21, 2004, now Pat. No. 6,846,709, which is a continuation-in-part of application No. 10/680,355, filed on Oct. 6, 2003.

(51) Int. Cl.
*H01L 21/8238* (2006.01)
(52) U.S. Cl. ............... 438/199; 438/206; 438/335; 438/336; 438/350
(58) Field of Classification Search .......... 438/199, 438/206, 335–336, 350
See application file for complete search history.

(56) References Cited

U.S. PATENT DOCUMENTS

| | | | | |
|---|---|---|---|---|
| 5,026,663 A | * | 6/1991 | Zdebel et al. | 438/556 |
| 5,402,002 A | * | 3/1995 | Meister et al. | 257/586 |
| 6,194,829 B1 | * | 2/2001 | Lu | 313/495 |
| 6,413,802 B1 | | 7/2002 | Hu et al. | 438/151 |
| 6,525,403 B2 | | 2/2003 | Inaba et al. | 257/618 |
| 2002/0060338 A1 | | 5/2002 | Zhang | 257/328 |

OTHER PUBLICATIONS

Wolf, Silicon Processing for the VLSI Era, 1986, Lattice Press, vol. 1, pp. 520-529.*
J.M. Hergenrother et al. (Bell Laboratories, Lucent Technologies, Murray Hill, N.J. 07974, USA), "The Vertical Replacement-Gate (VRG) MOSFET: A 50-nm Vertical MOSFET with Lithography-Independent Gate Length", IEEE 1999 Int'l Electron Devices Meeting, pp. 3.6.1-3.6.4.
D. Monroe et al. (Lucent Technologies, Bell Labs Innovations), "Revolutionary Transistor Turns Silicon World on End", Apr. 2000, Lucent Technologies, 3 pages.

* cited by examiner

*Primary Examiner*—Nguyen Thanh
(74) *Attorney, Agent, or Firm*—Schneck & Schneck; Thomas Schneck

(57) ABSTRACT

A method for formation of openings in semiconducting devices not limited by constraints of photolithography include forming a first dielectric layer over a semiconducting substrate, depositing a polysilicon layer over the first dielectric layer, forming a second dielectric layer over the polysilicon layer, forming a third dielectric layer over the second dielectric layer, etching a dielectric window through the third dielectric layer, forming a fourth dielectric layer into the dielectric window and over the third dielectric layer, the fourth dielectric layer being of a material dissimilar to the second dielectric layer, etching the fourth dielectric layer anisotropically using an etchant with a high selectivity ratio between the fourth dielectric layer and the second dielectric layer thereby forming a spacer, and etching portions of the first and second dielectric layers and the polysilicon layer anisotropically, the portions underlying an area bounded by a periphery of the spacer thereby forming the opening.

18 Claims, 10 Drawing Sheets

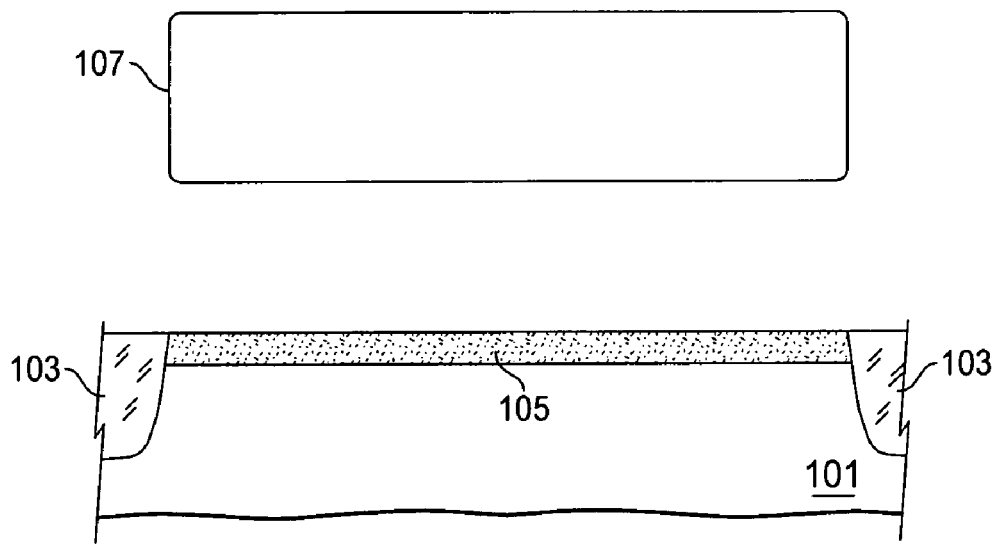
Fig._1
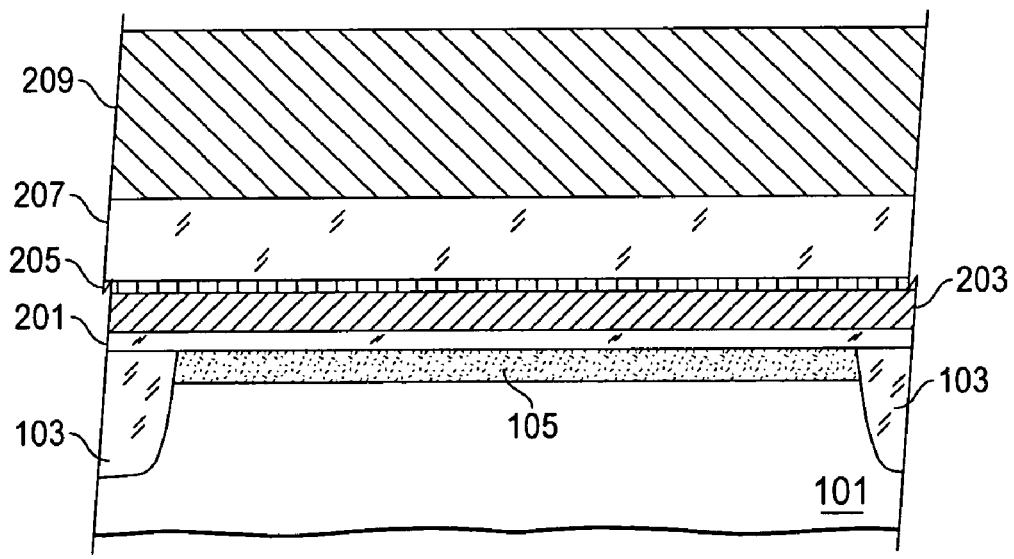
Fig._2

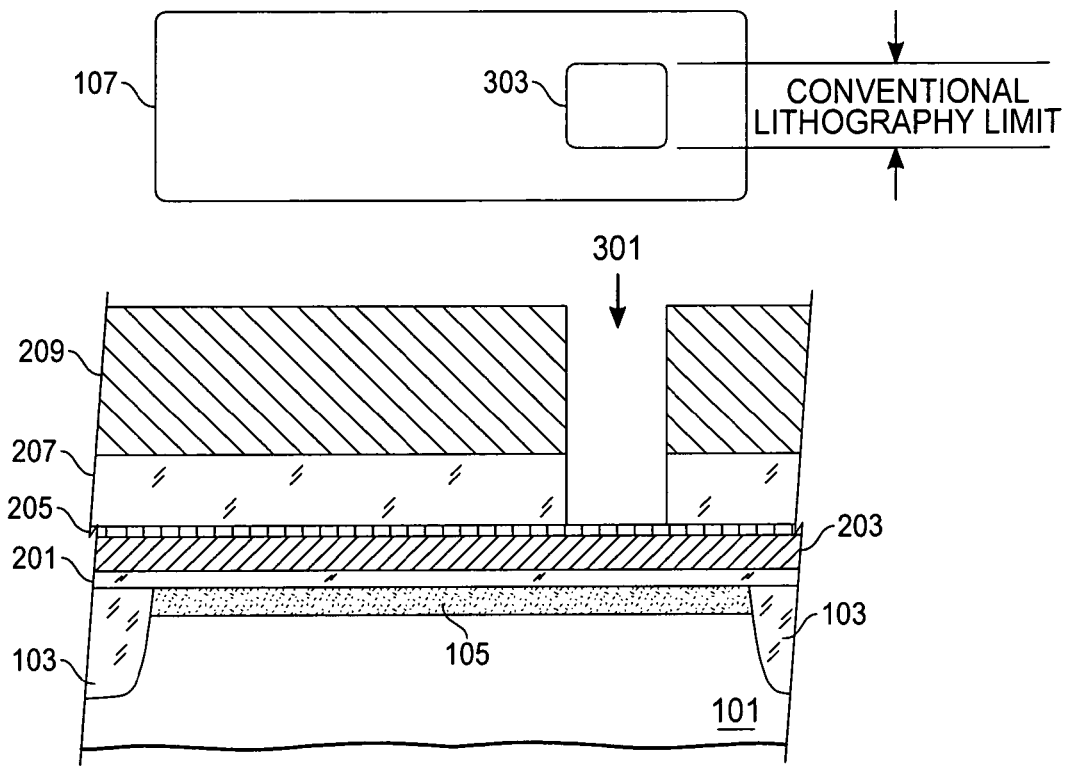
*Fig._3*
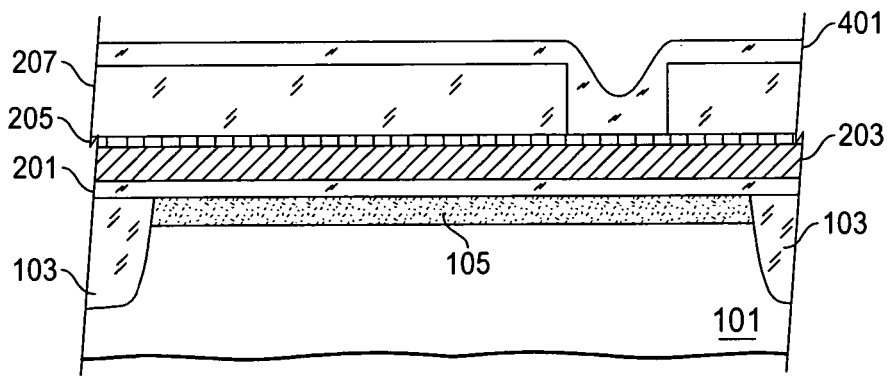
*Fig._4*

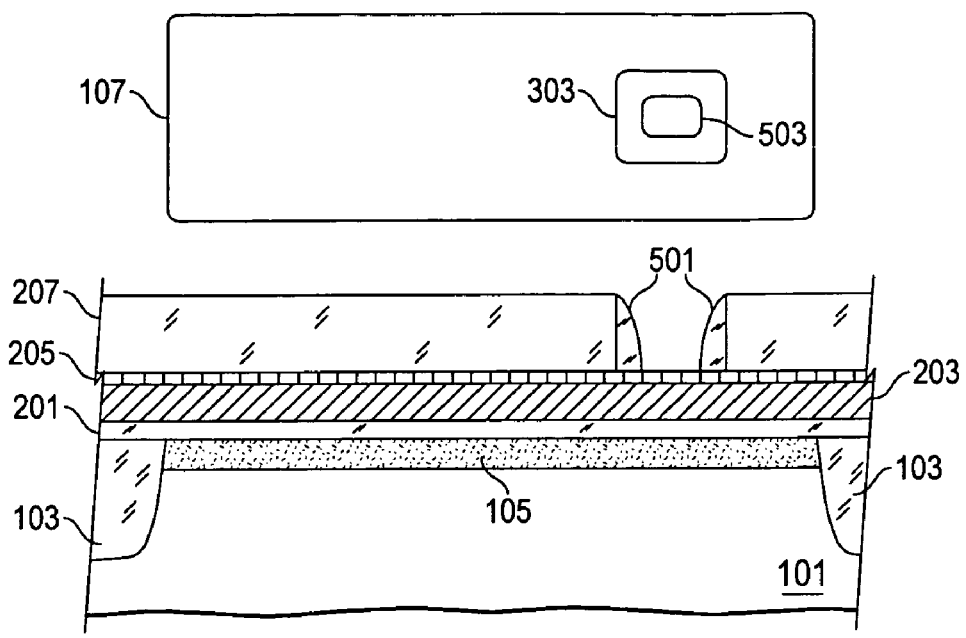
Fig._5
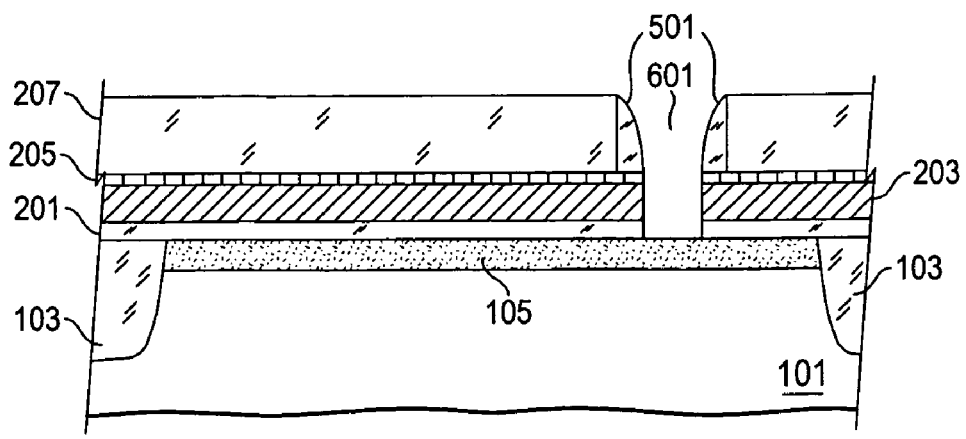
Fig._6

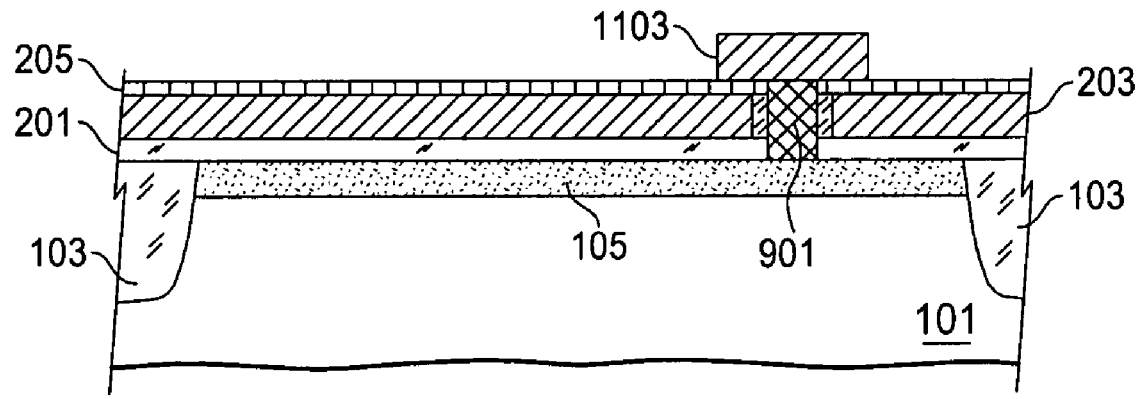
Fig. _ 11
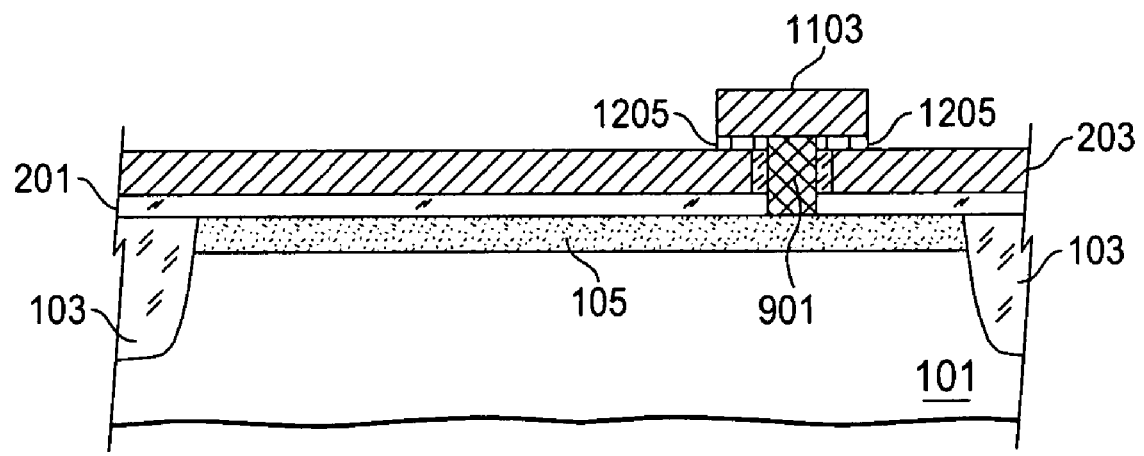
Fig. _ 12

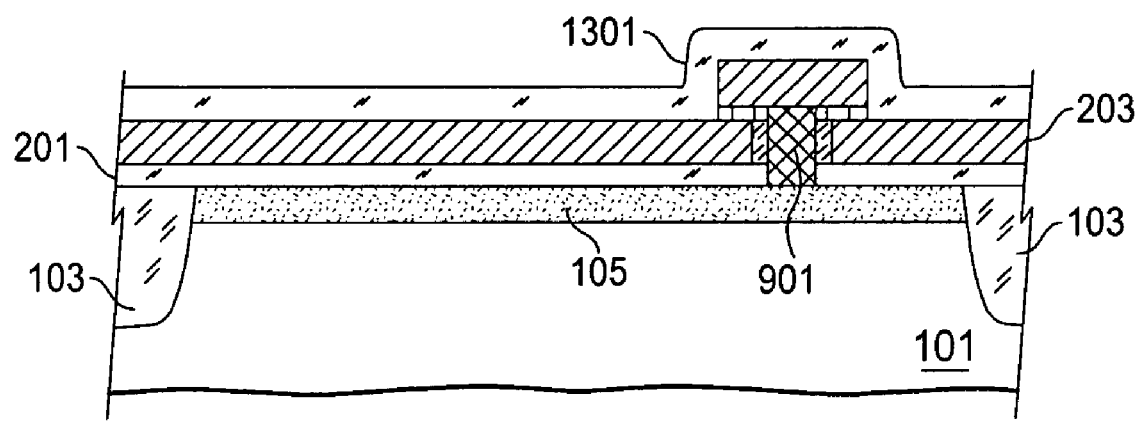
Fig._13
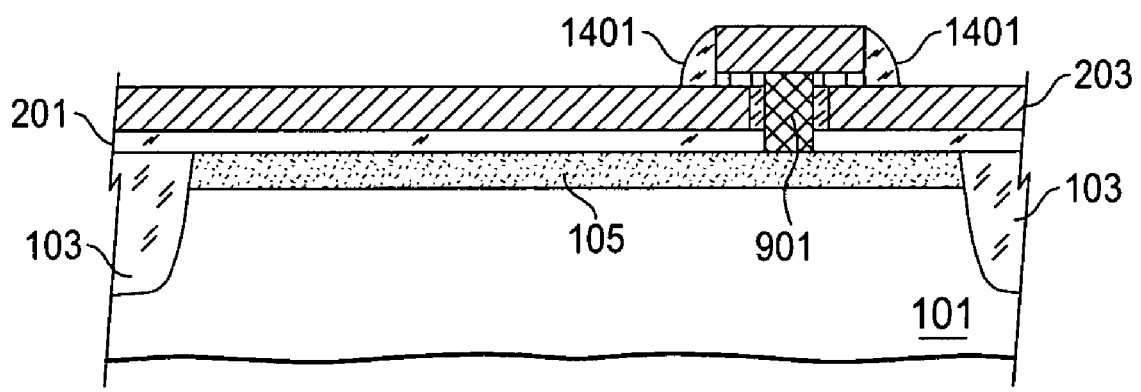
Fig._14

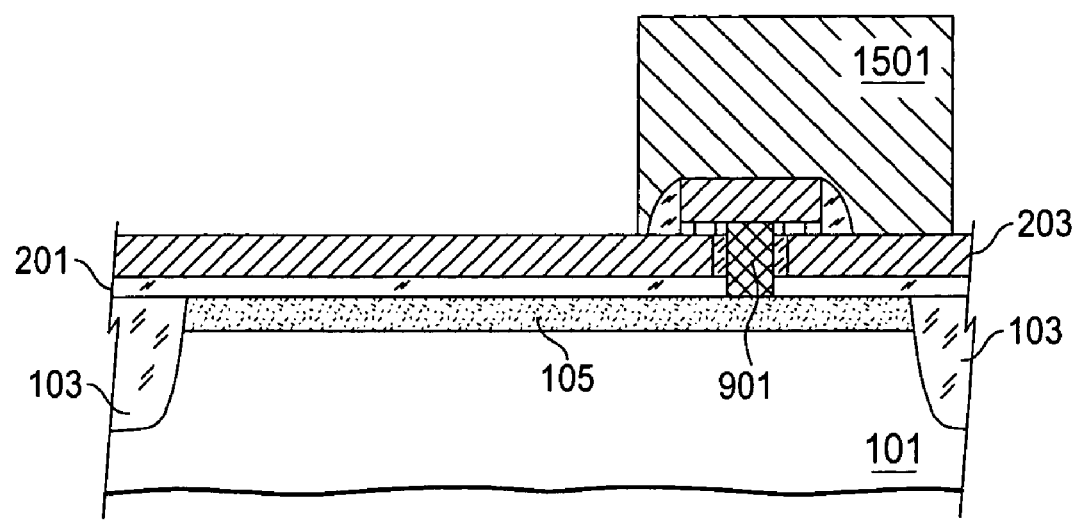
Fig._15
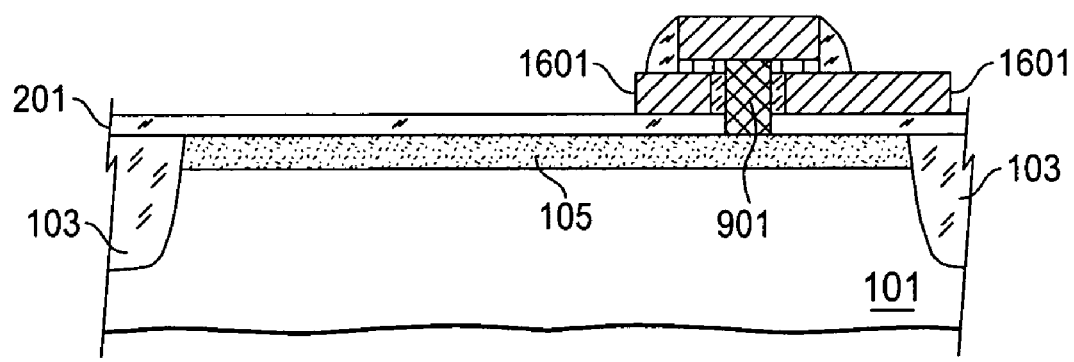
Fig._16

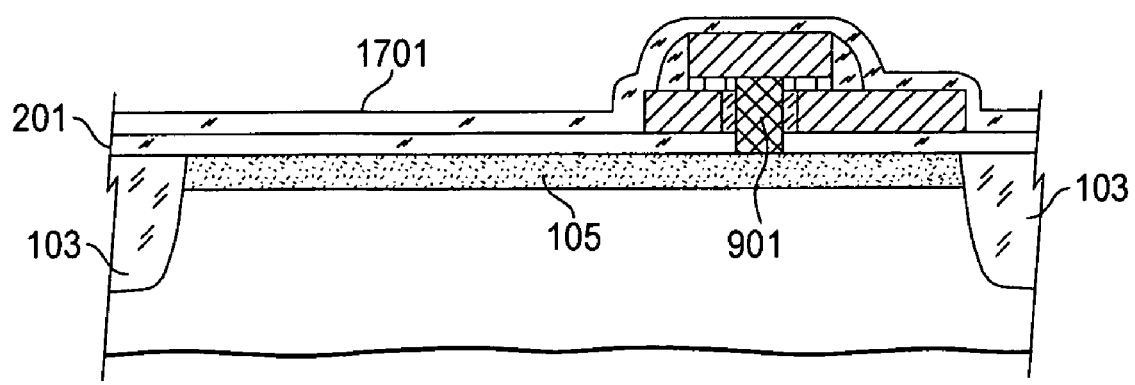
Fig._17
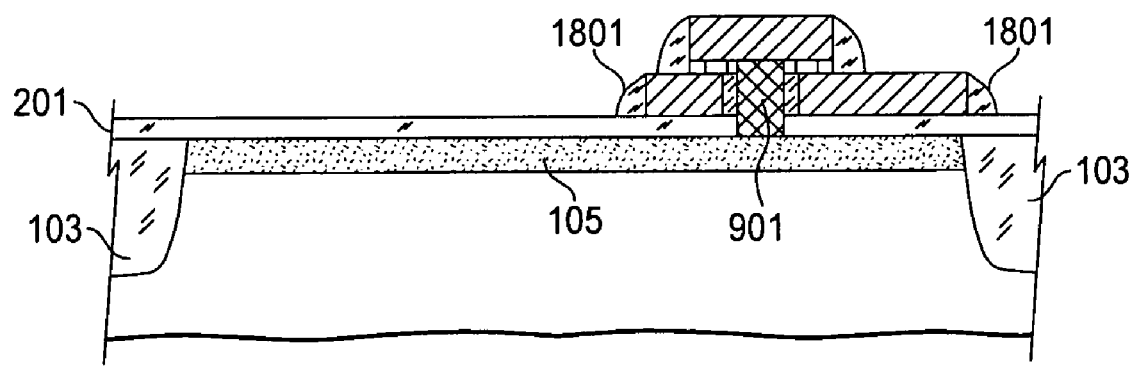
Fig._18

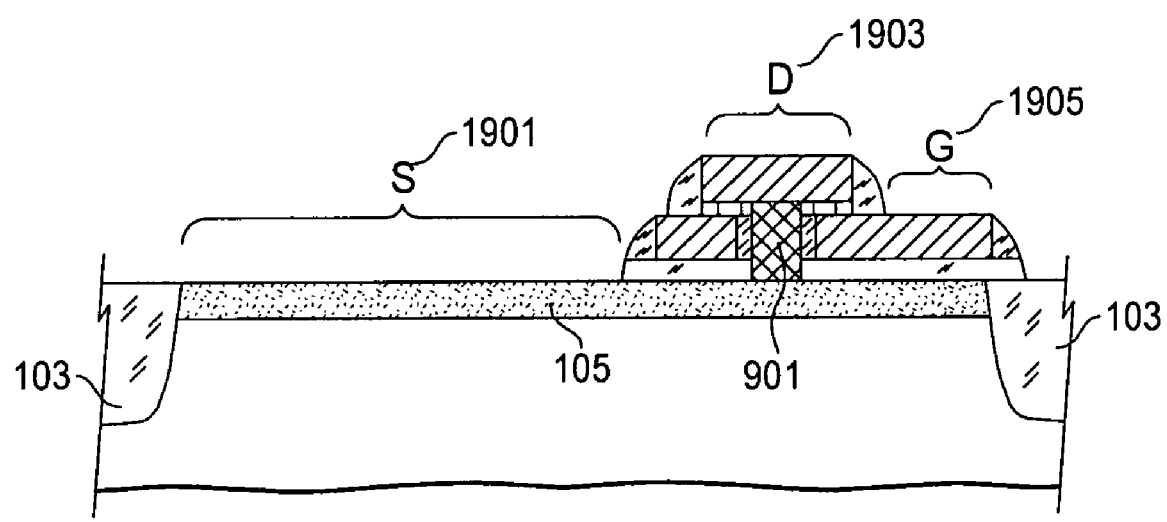
Fig. _ 19

LITHOGRAPHY-INDEPENDENT FABRICATION OF SMALL OPENINGS FOR FORMING VERTICAL MOS TRANSISTOR

CROSS-REFERENCE TO RELATED APPLICATION

This application is a continuation-in-part of U.S. patent application Ser. No. 10/761,876 filed Jan. 21, 2004, now U.S. Pat. No. 6,846,709, which is a continuation-in-part of U.S. patent application Ser. No. 10/680,355, filed Oct. 6, 2003, published as publication 20050073026 on Apr. 7, 2005.

TECHNICAL FIELD

A present invention described herein relates generally to a process for fabricating an integrated circuit structure, and more specifically to electronic devices having semiconductor junctions and to a process for their manufacture.

BACKGROUND ART

There is a need in the integrated circuit art for obtaining increasingly smaller devices without sacrificing device performance. The small device size requires small device regions, precise and accurate alignment between regions, and minimization of parasitic resistances and capacitances. Device size can be reduced by putting more reliance on fine line lithography, but as discussed below, it becomes impractical or impossible to continue to reduce feature size and achieve the required greater increase in alignment accuracy. As lithography is pushed to its physical limits, yield and production throughput decrease.

Four governing performance parameters of a photolithographic system are limit-of-resolution, $L_r$, level-to-level alignment accuracy, depth-of-focus, and throughput. For purposes of this discussion, limit-of-resolution, level-to-level alignment, and depth-of-focus are physically constrained parameters.

Typical photolithographic techniques are limited by physical constraints of the photolithographic system involving actinic radiation wavelength, $\lambda$, and geometrical configurations of the projection system optics. According to Rayleigh's criterion, $$L_r = \frac{0.61\lambda}{NA}$$

where NA is the numerical aperture of the optical system and is defined as NA=n sin $\alpha$, where n is the index of refraction of the medium which the radiation traverses (usually air for this application, so n≅1) and $\alpha$ is a half-angle of the divergence of the actinic radiation. For example, using deep ultraviolet illumination (DUV) with $\lambda$=193 nm, and NA=0.7, the lower limit of resolution is 168 nanometers (1680 Å). Techniques such as phase shifted masks can extend this limit downward, but photomasks required in this technique are extremely expensive. This expense becomes greatly compounded with a realization that an advanced semiconductor process may employ more than 25 photomasks.

Along with the limit-of-resolution, the second parameter, level-to-level alignment accuracy becomes more critical as feature sizes on photomasks decrease and a number of total photomasks increases. For example, if photomask alignment by itself causes a reduction in device yield to 95% per layer, then 25 layers of photomask translates to a total device yield of $0.95^{25}$=0.28 or 28% yield (assuming independent errors). Therefore, a more complicated mask, such a phase shifted mask is not only more expensive but can cause device yield to suffer dramatically.

Further, although the numerical aperture of the photolithographic system may be increased to lower the limit-of-resolution, the third parameter, depth-of-focus, will suffer as a result. Depth-of-focus is inversely proportional to $NA^2$. Therefore, as NA increases, limit-of-resolution decreases but depth-of-focus decreases more rapidly. The reduced depth-of-focus makes accurate focusing more difficult especially on non-planar features such as "Manhattan Geometries" becoming increasingly popular in advanced semiconductor devices.

Recently, techniques have been developed to make smaller scale transistors and related devices. One such method of making transistors is described in a paper presented at the 1999 International Electron Devices Meeting and sponsored by IEEE, entitled "The Vertical Replacement-Gate (VRG) MOSFET: A 50-nm Vertical MOSFET with Lithography-Independent Gate Length, by J. M. Hergenrother et al. Here, Hergenrother et al. describes a method utilizing a vertical transistor technology wherein the gate and gate oxide are required to be applied in the final steps of the process.

U.S. Pat. No. 6,413,802 to Hu et al., describes a device fabricated in a silicon layer overlying an insulating layer (e.g., SIMOX) with the device extending from the insulating layer as a fin.

Further, U.S. Pat. No. 6,525,403, to Inaba et al., describes a process with a gate, source, and drain in a modified horizontal configuration.

U.S. patent application Publication No. 2002/0060338 by Zhibo Zhang describes a vertical FET device whereby source and drain regions are formed at respective ends of a vertical channel, and an insulated gate is formed adjacent the vertical channel.

Still other art has focused on vertical devices like those mentioned above with formation occurring on silicon-on-insulator (SOI). SOI and SIMOX have several disadvantages. These disadvantages include poor performance for memory devices (since the body of the device is floating), a requirement for extreme lithography on one or more of the process steps, and a drastic increase in price for the SOI material.

Additionally, in a conventional method for fabricating a bipolar device, a source window is directly opened without some means of providing an etch stop. A potential overetch produces a damaged region in the silicon and may result in excessive consumption of silicon underlying a contact. Further, formation of an oxide spacer without an etch stop presents manufacturing difficulties as timing and other recipe tolerances become overly stringent.

For at least the aforementioned reasons, integrated circuit manufacturers have been unable to sufficiently reduce a size of electronic devices while still maintaining high performance. The aforementioned art has limitations on either device performance or manufacturability due to structures used (e.g., SOI or SIMOX), limitations due to required lithography steps, or requirements for gate oxides to be performed late in a process, thereby limiting flexibility in design. In view of the desire for integrated circuits having higher device counts, smaller device sizes, and greater circuit performance, a need continues to exist for an improved process to manufacture the required devices without resorting to unrealistic and expensive photolithography requirements.

Accordingly, what is needed is a way to provide an improved process and structure for fabricating integrated circuit devices. Such a structure for producing integrated circuit devices would have devices with a reduced size with reasonable photolithographic tolerances.

DISCLOSURE OF INVENTION

Formation of elements of a vertical transistor is described, particularly, a gate-source-drain arrangement of a CMOS transistor. Vertical transistors are used frequently in the integrated circuit art. Accordingly, improved methods for their formation, which are not limited by constraints of photolithography due to a novel use of spacers and self-aligning techniques, have great utility and importance. Those of skill in the art will appreciate that the techniques described herein may be used to fabricate other types of devices as well. For example, junctions of a bipolar transistor (as well as other device junction types) may be fabricated using the methods described herein.

In one embodiment, a method for formation of openings (e.g., a via or trench) in semiconducting devices not limited by constraints of photolithography include forming a first dielectric layer over a semiconducting substrate, depositing a polysilicon layer over the first dielectric layer, forming a second dielectric layer over the polysilicon layer, forming a third dielectric layer over the second dielectric layer, etching a dielectric window through the third dielectric layer, forming a fourth dielectric layer into the dielectric window and over the third dielectric layer, the fourth dielectric layer being of a material dissimilar to the second dielectric layer, etching the fourth dielectric layer anisotropically using an etchant with a high selectivity ratio between the fourth dielectric layer and the second dielectric layer thereby forming a spacer, and etching portions of the first and second dielectric layers and the polysilicon layer anisotropically, the portions underlying an area bounded by a periphery of the spacer thereby forming the opening.

In another embodiment, a method of fabricating a device includes implanting a dopant into an area of a semiconducting substrate where the area is located within a region isolated by a dielectric isolator. A film stack is then deposited over the implanted and dielectric separator areas. The film stack includes, inter alia, a first dielectric layer and a first polysilicon layer. A dielectric window is then etched through the first dielectric layer and a second dielectric layer is deposited into the dielectric window and over the film stack. The second dielectric layer is etched anisotropically to form a first spacer. The spacer is used to reduce the size of transistor features well below the limits of photolithography. Portions of the film stack lying between the implanted area and the first dielectric layer are then anisotropically etched to form an epitaxial opening. The opening is filled with epitaxial silicon, thereby forming an epitaxial channel. A second polysilicon layer is formed over the epitaxial channel and a third dielectric layer is deposited over the second polysilicon layer and surrounding areas. The third dielectric layer is consequently etched anisotropically to form a second spacer and the first polysilicon layer is anisotropically etched. A fourth dielectric layer is deposited over the second polysilicon layer and the first polysilicon layer and the fourth dielectric layer is etched to form a third spacer. Finally, any remaining layers surrounding the third spacer are etched down to a level substantially coplanar with the implant area.

The present invention also defines an electronic device. In one embodiment, a semiconductor substrate is disclosed having thereon at least one dopant-implanted region laterally enclosed by a dielectric isolation region. A topmost surface of the dielectric isolation region and the implanted region are substantially coplanar with a principal surface of the substrate. An epitaxial channel is disposed on the topmost surface of the implanted region and is electrically coupled to the implanted region. A periphery of the epitaxial channel is defined by a first dielectric spacer. A polysilicon region is peripherally disposed to and surrounds the epitaxial channel. The polysilicon region at least partially overlays the implanted region and is isolated from direct electrical coupling with the implanted region by a dielectric layer.

BRIEF DESCRIPTION OF THE DRAWINGS

FIG. 1 shows an exemplary embodiment of an isolated implant area used to create an electronic device structure of the present invention.

FIG. 2 is a schematic cross-sectional view of the isolated implant area of FIG. 1 with a film stack.

FIG. 3 shows the deposited films of FIG. 1 with an etched dielectric mask window.

FIG. 4 shows a conformal blanket deposition of a dielectric layer filling the mask window of FIG. 3.

FIG. 5 shows the conformal blanket deposition of FIG. 4 anisotropically etched, forming a dielectric spacer.

FIG. 6 shows an anisotropic etch of film layers down to the implant area through the window formed by the dielectric spacer of FIG. 5.

FIG. 11 shows an etched polysilicon layer of FIG. 10 which will become a gate area of the electronic device.

FIG. 12 shows the etched polysilicon layer of FIG. 11 with an etched underlying nitride layer, further defining the gate area.

FIG. 13 shows a conformal dielectric blanket layer deposited over the gate area of FIG. 12.

FIG. 14 shows the dielectric blanket layer of FIG. 13 after an anisotropic etch, leaving an oxide spacer.

FIG. 15 shows a developed and etched photoresist layer over the gate area of FIG. 14.

FIG. 16 shows an etched drain area formation remaining after polysilicon etch and removal of the photoresist layer of FIG. 15.

FIG. 17 shows a conformal dielectric blanket layer over the gate and drain areas of FIG. 16.

FIG. 18 shows the dielectric blanket layer of FIG. 17 after an anisotropic etch and leaving an oxide spacer surrounding the drain area.

FIG. 19 shows the electronic device structure of FIG. 18 after significant back-end-of-line processing steps associated with the present invention are completed.

MODES FOR CARRYING OUT INVENTION

Figure 7:
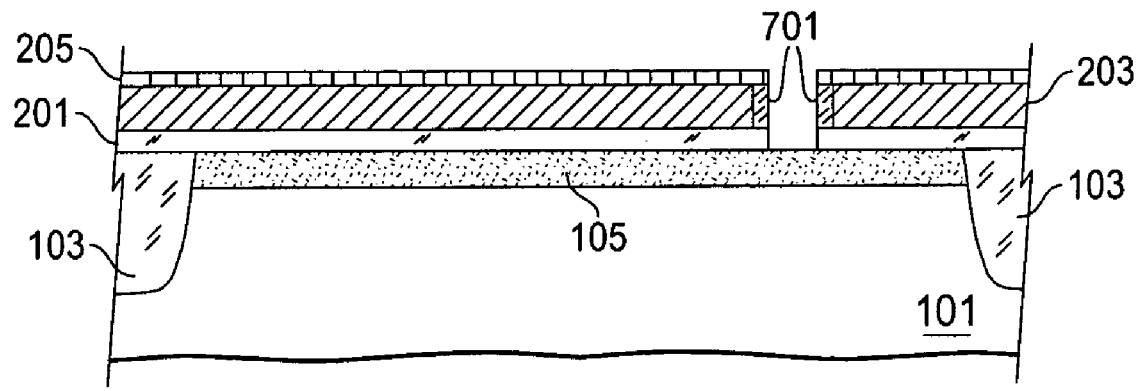
FIG. 7 shows the removal of overlying dielectric layers of FIG. 6 with a vertical sidewall gate oxidation.
Figure 8:
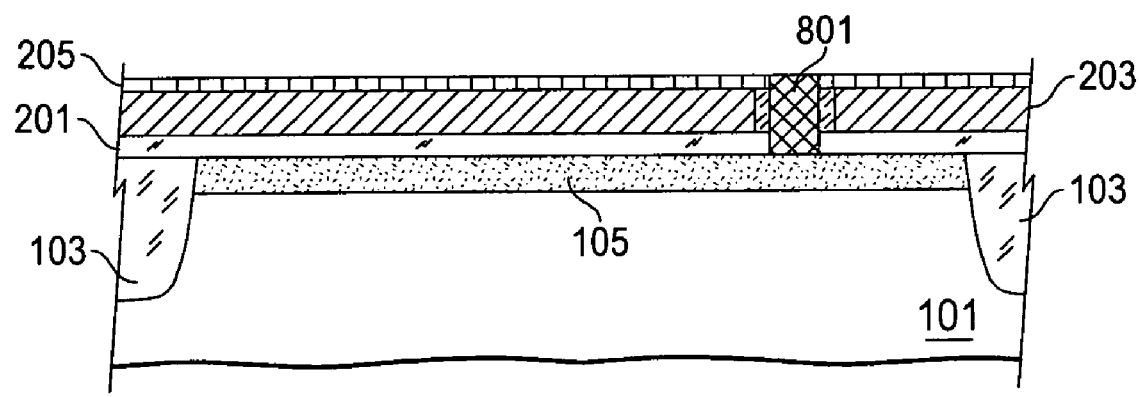
FIG. 8 shows an epitaxial channel fill of a gate area formed on FIGS. 6 and 7.

With reference to FIGS. 1–19, an exemplary embodiment of the present invention is described in detail according to the following process steps. FIG. 1 shows an exemplary embodiment of an isolated implant area 105 used to create an electronic device structure of the present invention. FIG. 1 includes a base substrate 101, an isolation dielectric area 103, and the implanted substrate area 105. An extent 107 of the implanted area 105 is shown in a plan view at the top of FIG. 1. All areas are formed by processes well-known to one of skill in the art.

The base substrate 101 is frequently a silicon wafer. In this embodiment, the specific silicon wafer is doped within the confines of the isolation dielectric area to form the implant area 105. Alternatively, another elemental group IV semiconductor or compound semiconductor (e.g., groups III–V or II–VI) may be selected for base substrate 101. The isolation dielectric area 103 is, for example, deposited or thermally grown oxide or deposited nitride.

FIG. 2 is a schematic cross-sectional view of the isolated implant area 105 of FIG. 1 with an overlying film stack. In this example, the film stack includes a pad oxide 201, a first polysilicon layer 203, a nitride layer 205, a dielectric hard mask 207, and a photoresist layer 209. The dielectric hard mask 207 may be, for example, a CVD-deposited oxide.

In a specific exemplary embodiment, nominal film thicknesses and methods of deposit are provided as follows: the pad oxide 201 is a deposited 500 Å–1000 Å oxide, the first polysilicon layer 203 is 1000 Å thick, the nitride layer 205 is 300 Å thick, the dielectric (e.g., oxide) layer 207 is 2000 Å–3000 Å thick, and the photoresist layer 209 is 0.5 µm–1.5 µm thick.

FIG. 3 shows the deposited films of FIG. 1, after exposing the photoresist layer 209, developing, and etching through the photoresist layer 209 and underlying hard mask 207, and producing a mask window 301. Etching through the hard mask 207 may be accomplished through various wet etch (e.g., in hydrofluoric, such as contained in a standard buffered oxide etch, or orthophosphoric acid) or dry etch (e.g., reactive-ion etch (RIE)) techniques. After the hard mask 207 etch, the photoresist layer 209 is stripped. A plan view at the top of FIG. 3 shows a limit 303 to conventional lithography. For example, the limit 303 with contemporary lithography is 0.18 µm.

With reference to FIG. 4, a conformal blanket deposition of an oxide spacer layer 401 fills the mask window 301 and overlies the surrounding hard mask 207. The oxide spacer layer 401 is then anisotropically etched, for example, by RIE. An etchant is chosen with a high selectivity ratio between oxide and nitride allowing the nitride layer 205 to act as an etch stop. The remaining oxide spacer 501 (FIG. 5), substantially extends the limit 303 of conventional lithography as shown by a reduced-dimension mask opening 503. For example, a typical 0.18 µm design rule with an oxide spacer 501 thickness of 0.05 µm at the base produces a 0.08 µm mask opening 503.

Figure 9:
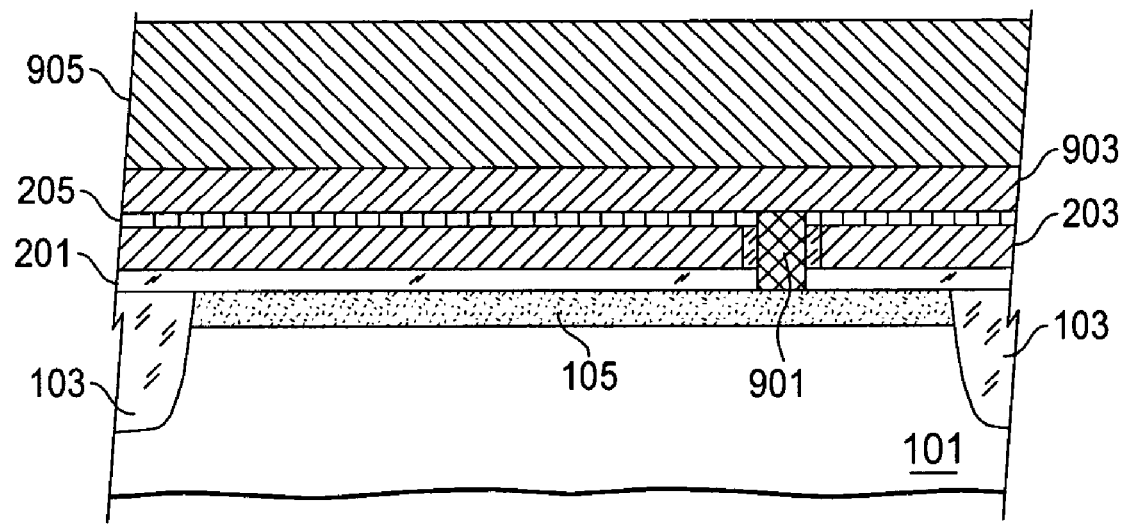
FIG. 9 shows the epitaxial fill area of FIG. 8 after chemical-mechanical planarization of the epitaxial silicon and deposition of polysilicon and photoresist.
Figure 10:
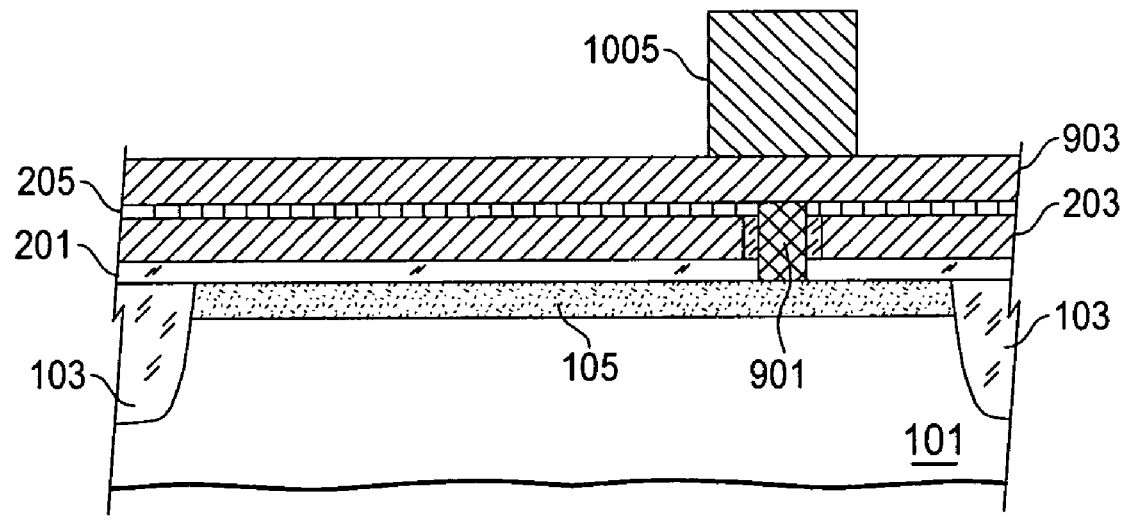
FIG. 10 shows the photoresist layer of FIG. 9 after development and etch.

With reference to FIG. 6, the oxide spacer 501, along with the hard mask 207, provide an mask for anisotropic etching through the underlying layers (i.e., the nitride layer 205, the first polysilicon layer 203, and the pad oxide 201), and down to the implanted area 105, thereby producing an epitaxial ("epi") opening 601. In FIG. 7, the overlying hard mask 207 and oxide spacer 501 are stripped by, for example, a buffered-oxide wet-etch technique. A thermal oxidation step produces a gate oxide 701 on vertical walls of the first polysilicon layer 203. Any oxide regrowth on the bottom of the bottom of the epi opening 601 (i.e., oxide on the implanted area 105) may be remove by techniques such as RIE. Precautions are taken to minimize or eliminate any native oxide growth on the bottom of the epi opening 601 after etch. Techniques to minimize native oxide growth from silicon are well known in the art and will not be discussed herein. Thermal oxide growth techniques combine oxygen with underlying silicon (i.e., the first polycrystalline silicon layer 203). Mechanisms for thermal oxide growth are well understood with 44% of the underlying polysilicon 203 being consumed to form the gate oxide 701. The epi opening 601 is then filled (FIG. 8) with an epitaxial silicon 801 channel deposition. The epitaxial silicon is then planarized (e.g., by chemical mechanical planarization) and implanted, forming a planarized epi channel 901 (FIG. 9). A second polysilicon layer 903 and a second photoresist layer 905 are then deposited. In one specific exemplary embodiment, the second polysilicon layer 903 and the second photoresist layer, are nominally 1000 Å and 5000 Å thick, respectively. The second photoresist layer 905 is then exposed, developed, and etched leaving a second photoresist etch mask 1005 (FIG. 10). Areas of the first polysilicon not under the second photoresist etch mask 1005 layer 203 are then etched, for example, by RIE, leaving a drain polysilicon 1103 (FIG. 11). An additional etch of the nitride layer 205 leaving a nitride pad 1205 (FIG. 12) substantially completes the drain area.

With reference to FIG. 13, a conformal oxide layer 1301 is deposited (e.g., by an LPCVD process) over the drain polysilicon and surrounding area, and is then anisotropically etched, leaving an oxide spacer 1401 (FIG. 14). The oxide spacer provides for a self-aligning area that allows for overlay of features beyond what typical lithography and alignment techniques would ordinarily permit. Therefore, level-to-level alignment issues with multiple masks are eliminated as the levels are self-aligned. Additionally, feature sizes are determined by deposition and etching techniques and can be far smaller than features defined by photolithography and alignment alone.

In FIG. 15, photoresist is deposited and etched leaving a photoresist mask 1501. The photoresist mask 1501 serves as an etch mask for a polysilicon etch producing a polysilicon gate area 1601 (FIG. 16). A final CVD oxide is conformally deposited 1701 (FIG. 17), and anisotropically etched, leaving a gate area oxide spacer 1801 (FIG. 18). The drain area oxide spacer has the same self-aligning qualities as the oxide spacer 1401, supra. In FIG. 19, a final anisotropic etch reveals the implanted substrate area 105 and forms a source region 1901, a gate region 1903, and a drain region 1905.

Following the final anisotropic etch, techniques well known to a skilled artisan are completed to form, for example, additional implants diffused into the drain polysilicon, metallization, electronic-test, and packaging steps to complete the semiconductor device.

To facilitate an understanding of the present invention, a process and arrangement for forming a vertical gate CMOS device has been discussed herein. However, the invented process arrangements of layers and regions described herein are also useful for forming a wide range of other device types and structures having utility as individual devices or in combinations. For example, although an embodiment depicts formation of a CMOS device, a skilled artisan will recognize that the present invention is readily adaptable to a bipolar transistor or other type of semiconducting device. Further, the techniques described herein are also readily amenable to constructing features such as double gates by expanding the gate masking step with a separation of gate areas by dielectric deposition or growth.

Additionally, many industries allied with the semiconductor industry could make use of this technique. For example, a thin-film head (TFH) process in the data storage industry or an active matrix liquid crystal display (AMLCD) in the flat panel display industry could readily make use of the processes and techniques described herein. The term "semiconductor" should be recognized as including the aforementioned and related industries. Additionally, although process steps and techniques are shown and described in detail, a skilled artisan will recognize that other techniques and methods may be utilized which are still included within the scope of the appended claims. For example, there are frequently several techniques used for depositing a film layer (e.g., chemical vapor deposition, plasma-enhanced vapor deposition, epitaxy, atomic layer deposition, etc.). Although not all techniques are amenable to all film types described herein, one skilled in the art will recognize that multiple methods for depositing a given layer and/or film type may be used. Further, dopants may be added by techniques other than implanting; for example, by diffusion. Also, the lithography-independent fabrication techniques may readily be employed by etching partially, as opposed to fully, through a previously formed dielectric layer followed by an additional dielectric fill. The same fabrication techniques presented herein for fabrication of openings are readily adaptable to a trench, via or other opening. Therefore, an opening in this context also defines a trench with a high length-to-width aspect ratio.

As will be recognized by a skilled artisan, all of the aforementioned techniques may be adaptable to the present invention as disclosed. Therefore, a scope of the present invention shall only be limited by the scope of the appended claims.

What is claimed is:

1. A method of fabricating a small opening for forming a vertical MOS transistor comprising:
   doping a subsurface area of a semiconducting substrate to form a source region;
   forming a first dielectric layer over the doped area of the semiconducting substrate;
   depositing a first polysilicon layer over the first dielectric layer;
   forming a second dielectric layer over the first polysilicon layer;
   forming a third dielectric layer over the second dielectric layer;
   etching a dielectric window through the third dielectric layer;
   forming a fourth dielectric layer into the dielectric window and over the third dielectric layer, the fourth dielectric layer being of a material dissimilar to the second dielectric layer;
   etching the fourth dielectric layer anisotropically using an etchant with a high selectivity ratio between the fourth dielectric layer and the second dielectric layer thereby forming a spacer;
   etching portions of the first and second dielectric layers and the first polysilicon layer anisotropically, the portions underlying an area bounded by a periphery of the spacer thereby forming the opening;
   filling the opening with epitaxial silicon, thereby forming an epitaxial channel;
   forming a second polysilicon layer over the epitaxial channel thereby forming a drain layer;
   forming a second spacer circumscribing the second polysilicon layer thereby defining a drain;
   etching portions of the first polysilicon layer using the second spacer as a mask to expose polysilicon proximate to the channel thereby defining a gate;
   forming a third spacer circumscribing the first polysilicon layer; and
   etching portions of the first and second dielectric layers using the third spacer as a mask thereby exposing the source region.

2. The method of claim 1 wherein the first dielectric layer is comprised of a nitride layer formed over a pad oxide layer.

3. The method of claim 1 wherein the spacer is comprised of oxide.

4. The method of claim 1 wherein the first, third, and fourth dielectric layers are comprised of oxide.

5. The method of claim 1 wherein the second dielectric layer is a nitride layer.

6. Fabricating an opening in a vertical transistor manufacturing method comprising:
   forming a first dielectric layer on at least a first face of a semiconducting substrate;
   depositing a first polysilicon layer over the first dielectric layer;
   forming a second dielectric layer over the first polysilicon layer;
   forming a third dielectric layer over the second dielectric layer;
   etching a dielectric window through the third dielectric layer;
   forming a fourth dielectric layer into the dielectric window and over the third dielectric layer, the fourth dielectric layer being of a material dissimilar to the second dielectric layer; etching the fourth dielectric layer anisotropically using an etchant with a high selectivity ratio between the fourth dielectric layer and the second dielectric layer thereby forming a spacer;
   etching portions of the first and second dielectric layers and the first polysilicon layer anisotropically, the portions underlying an area bounded by a periphery of the spacer thereby forming the opening;
   filling the opening with epitaxial silicon;
   forming a second polysilicon layer over the epitaxial silicon;
   forming a second spacer circumscribing the second polysilicon layer;
   etching the first polysilicon layer; and
   forming a third spacer circumscribing the first polysilicon layer.

7. The method of claim 6 wherein the first dielectric layer is comprised of a nitride layer formed over a pad oxide layer.

8. The method of claim 6 wherein the spacer is comprised of oxide.

9. The method of claim 6 wherein the first, third, and fourth dielectric layers are comprised of oxide.

10. The method of claim 6 wherein the second dielectric layer is a nitride layer.

11. The method of claim 6 further comprising doping the semiconducting substrate within an area bounded by the opening overlying the semiconducting substrate.

12. The method of claim 11 wherein the doping is performed by implanting a dopant into the semiconducting substrate.

13. A method of fabricating a small opening for forming a vertical MOS transistor comprising:
   doping an area of a semiconducting substrate to forming a source region;

depositing a film stack over the doped area of the semiconductor substrate, the film stack including a first dielectric layer over a first polysilicon layer;

etching a dielectric window through the first dielectric layer;

forming a first oxide spacer within the dielectric window;

etching portions of the film stack lying between the doped area and the first dielectric layer anisotropically thereby forming the opening;

filling the opening with epitaxial silicon, thereby forming an epitaxial channel;

forming a second polysilicon layer over the epitaxial channel thereby forming a drain layer;

forming a second spacer circumscribing the second polysilicon layer thereby defining a drain;

etching the first polysilicon layer using the second spacer as a mask to expose polysilicon proximate to the channel thereby defining a gate;

forming a third spacer circumscribing the first polysilicon layer; and etching portions of the first and second dielectric layers using the third spacer as a mask thereby exposing the source region.

14. The method of claim 13 wherein the first oxide spacer is formed by depositing a second dielectric layer into the dielectric window and over the film stack and then etching the second dielectric layer anisotropically to form the first oxide spacer.

15. The method of claim 13, wherein the second spacer is formed by depositing a third dielectric layer over the second polysilicon layer and surrounding areas and anisotropically etching the third dielectric layer.

16. The method of claim 13, wherein the third spacer is formed by depositing a fourth dielectric layer over the second polysilicon layer and the first polysilicon layer and anisotropically etching the fourth dielectric layer.

17. The method of claim 16 further comprising etching any remaining layers surrounding the third spacer down to substantially a level of the doped source region.

18. The method of claim 13 further comprising isolating the doped source region by a dielectric isolator.

* * * * *